United States Patent [19]

Caywood

[11] 3,943,543
[45] Mar. 9, 1976

[54] THREE LEVEL ELECTRODE CONFIGURATION FOR THREE PHASE CHARGE COUPLED DEVICE

[75] Inventor: John Millard Caywood, Richardson, Tex.

[73] Assignee: Texas Instruments Incorporated, Dallas, Tex.

[22] Filed: July 26, 1974

[21] Appl. No.: 492,111

[52] U.S. Cl. .................. 357/24; 357/68; 357/70
[51] Int. Cl.² H01L 29/78; H01L 23/48; H01L 29/44
[58] Field of Search ..................... 357/24, 68, 70

[56] References Cited
UNITED STATES PATENTS

| | | | |
|---|---|---|---|
| 3,760,202 | 9/1973 | Kosonocky | 357/24 |
| 3,826,926 | 7/1974 | White et al. | 357/24 |

Primary Examiner—Andrew J. James
Assistant Examiner—E. Wojciechowicz
Attorney, Agent, or Firm—Harold Levine; James T. Comfort; Richard L. Donaldson

[57] ABSTRACT

The specification discloses a three level electrode configuration for a charge coupled device having a channel for movement of charge packets therethrough. The configuration includes three spaced apart phase buses disposed parallel along one side of the channel. Sets of phase electrodes extend from each of the phase buses across the channel. Adjacent ones of the phase electrodes from different phase buses are formed on different levels and have laterally offset and overlapping edges. Insulation layers are disposed between the phase electrodes on different levels.

12 Claims, 4 Drawing Figures

THREE LEVEL ELECTRODE CONFIGURATION FOR THREE PHASE CHARGE COUPLED DEVICE

This invention relates to charge coupled devices and more particularly relates to a multilevel electrode configuration for a three phase charge coupled device.

Charge coupled devices (CCDs) generally comprise a channel defined in a semiconductor layer with a plurality of clock or phase electrodes formed across the channel. Upon proper application of clock signals to the electrodes, charge packets are moved along the channels to provide a shift register function. For charge coupled devices which are to operate at high clock rates, it is desirable to have short electrode lengths in the direction of travel of the charge packet, because it may be shown that the free transfer time is strongly dependent upon electrical length. However, it is difficult to fabricate charge coupled devices with electrodes appreciably smaller than 0.3 mils utilizing conventional single or double level electrode systems, especially if all of the phase electrodes must be brought out on one side of the CCD channel as is required for serial-parallel (S-P) or serial-parallel-serial (S-P-S) devices.

In accordance with the present invention, a multilevel electrode configuration for a charge coupled device enables very short phase electrode lengths. The electrode configuration includes three spaced apart phase buses which are disposed in parallel along one side of the CCD channel. Phase electrodes extend from each of the phase buses across the channel. Adjacent phase electrodes from different phase buses are formed on three levels and have laterally offset and overlapping side portions. Insulation layers are disposed between phase electrodes on different levels.

In accordance with another aspect of the invention, an electrode configuration for a three phase charge coupled device having a channel defined in a semiconductor body includes a first phase bus disposed along one side of the channel and further includes first spaced apart phase electrodes which extend from the first bus across the channel on a first level. A second phase bus is disposed parallel to the side of the first phase bus but more remote from the channel and includes second spaced apart phase electrodes which extend over the first phase bus on a second level and span the channel. A third phase bus is disposed parallel to the side of the second phase bus and more remote from the channel and includes third spaced apart phase electrodes which extend over the first and second phase buses on a third level and span the channel. Ones of the first, second and third phase electrodes are sequentially positioned over each bit region of the channel and are laterally offset relative to one another.

For a more complete description of the present invention and for further objects and advantages thereof, reference is now made to the following description taken in conjunction with the accompanying Drawings, in which.

Figure 1:
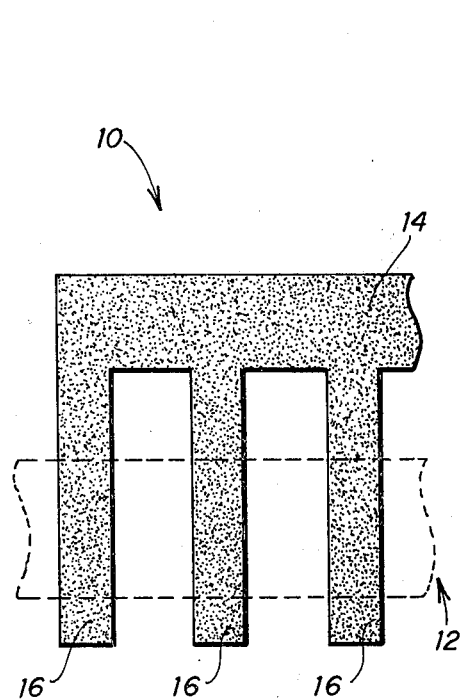
FIG. 1 is a top view of the first metallization layer for forming a phase bus and electrodes for a charge coupled device according to the present invention.

Referring to the Drawings, FIG. 1 illustrates the first metallization layer used to form the phase electrode system of the present invention. FIG. 1 illustrates a semiconductor body 10 having a channel 12 formed therein by conventional techniques through which charge packets are to be transferred under the control of three phase voltage pulses applied to three sets of phase electrodes. Although only one channel 12 is illustrated, it will be understood that a plurality of parallel channels will often be placed side by side, with the phase electrodes spanning all of the channels. As an example of the construction of the channel 12, a semiconductor P-type body may be normally boron doped and diffused along parallel strips with P+ boron in order to change the threshold level and thereby define the boundaries of the channel 12.

As shown in FIG. 1, a first clock or phase bus 14 is formed parallel to the channel 12 and includes a plurality of spaced apart phase electrodes 16 which extend from the bus 14 across the channel 12. The bus 14 and electrodes 16 may be formed by any conventional technique wherein a conductor layer is formed over a semiconductor substrate and patterned in the manner shown in FIG. 1, and then coated with a thin insulation layer. For example, the bus and electrodes may be formed by depositing aluminum and patterning the aluminum according to well-known photolithographical techniques. The aluminum may then be anodized to form an insulation layer thereover. Alternatively, a layer of doped polysilicon may be disposed over the semiconductor substrate and patterned to form the bus 14 and electrodes 16. The oxide over the channel may then be etched out using the patterned polysilicon as a mask and the silicon may be oxidized to regrow the oxide and to grow an insulating layer over the bus and electrodes.

Figure 2:
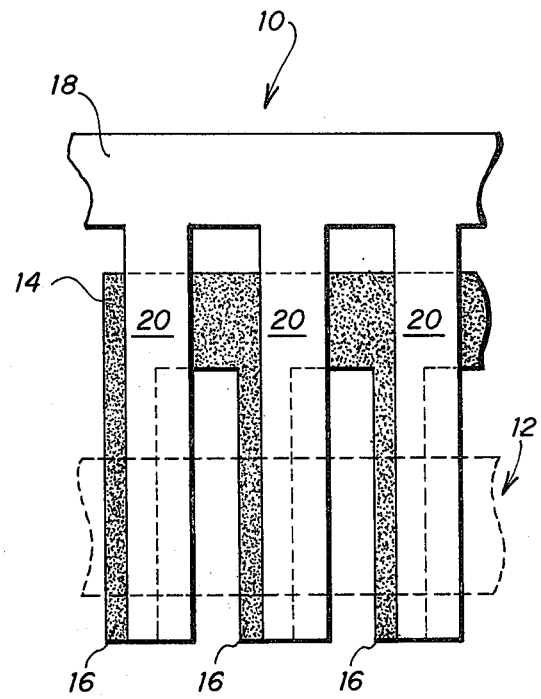
FIG. 2 is a top view of the second metallization layer of the present invention.

After deposition of the first conductor layer, a second level of conductor is deposited in the manner shown in FIG. 2. The second conductor layer includes a second phase bus 18 which extends parallel to the channel 12 and which includes a plurality of phase electrodes 20 which extend from the bus 18 over the phase bus 14 and across channel 12 in the manner illustrated. As shown in FIG. 2, the phase electrodes 20 are laterally offset from phase electrodes 16 in order to provide overlapping of the electrode sides. The bus 14 is spaced between the bus 18 and the channel 12. The bus 18 and phase electrodes 20 are covered with a thin layer of insulation such that shorting will not occur between the phase electrodes 16 and 20.

Figure 3:
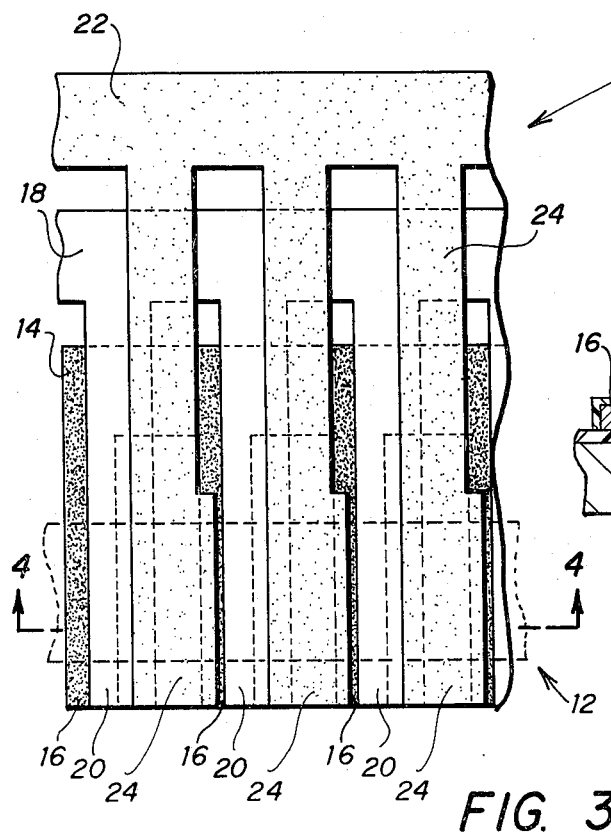
FIG. 3 is a top view of the third metallization layer according to the present invention.

FIG. 3 illustrates the formation of the third conductor level according to the invention. The third conductor level includes a third clock bus 22 having a plurality of phase electrodes 24 extending therefrom across the channel 12. As illustrated in FIG. 3, the phase electrodes 24 are laterally offset relative to electrodes 16 and 20 and thus overlap the electrodes. Buses 18 and 14 are disposed between the bus 22 and the channel 12 in the manner illustrated. As before, the conductor 22 and phase electrodes 24 are coated with insulation so as to be insulated from the remaining buses and electrodes.

Figure 4:
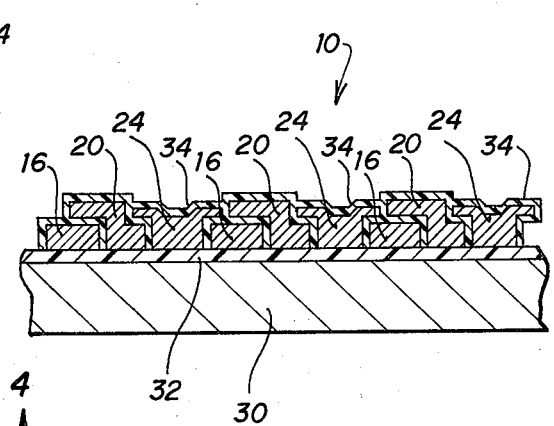
FIG. 4 is a cross sectional view taken generally along the section lines 4—4 of FIG. 3.

FIG. 4 illustrates a sectional view of the present electrode configuration taken generally along the section lines 4—4. As shown in FIG. 4, the CCD is formed from a silicon body 30 having a layer of oxide 32 formed in the conventional manner. The phase electrode 16 has a rectangular cross section and is overlapped by a portion of phase electrode 20 which has a generally Z-shaped cross section. Similarly, a portion of phase electrode 20 is overlapped by a portion of phase electrode 24 which also overlaps a portion of phase electrode 16. Phase electrode 24 thus is provided with a generally T-shaped cross section. As shown in FIG. 4, each of the phase electrodes according to the invention is coated with an insulating layer 34 to prevent shorting between the various phase electrodes and buses.

In one embodiment according to the invention, a CCD cell length or bit region was provided with a length of only 0.6 mils, with 0.1 mil electrode overlap being provided between the various phase electrodes. In accordance with this embodiment, 0.2 mils minimum space was provided between electrodes of the same metal levels. The same 0.2 mil minimum spacing occurs on the upper metallization levels wherein an electrode to electrode short would not hurt device operation. On the lower level of the device wherein such a short would render the device inoperable, the minimum spacing between electrodes is a relatively generous 0.3 mil. The present device is thus advantageous in that no intralevel shorts are possible with this configuration.

It will be understood that while the present invention is illustrated in FIG. 4 as having portions of the different phase electrodes laying in the same plane, that devices in some instances may be formed according to the invention with the various phase electrodes occupying three separate and vertically exclusive space metallization layers separated by insulating layers.

The present electrode configuration thus enables short phase electrode lengths and bus location along a single side of the CCD channel. The present configuration is easy to fabricate and does not require complex construction of via holes and the like.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. An electrode configuration for a three-phase charge coupled device having a channel defined in a semiconductor body and an insulating layer overlying said channel, comprising:
    a first phase bus disposed along one side of the channel and including first spaced apart phase electrodes which are disposed on said insulating layer and span the channel,
    a second phase bus disposed parallel to the side of said first phase bus and more remote from the channel and including second spaced apart phase electrodes which extend over said first phase bus in insulated relationship therewith and are disposed on said insulating layer and span the channel,
    a third phase bus disposed parallel to the side of said second phase bus and more remote from the channel and including third spaced apart phase electrodes which extend over said first and second phase buses, are disposed on said insulating layer and span the channel,
    ones of said first, second and third phase electrodes being sequentially positioned along the channel and insulated from each other to define bridge regions of said charge coupled device, and wherein each said phase electrode has an integral marginal edge portion spanning the channel in overlying relation with an upper surface of one of said first electrodes, and each said third phase electrode has an integral marginal edge portion spanning the channel in overlying relation with at least one of said first and second phase electrodes, and including insulation material between laterally adjacent and superposed portions of said first, second and third phase electrodes.

2. The electrode configuration of claim 1 wherein said bit regions have a length of approximately 6 mils.

3. The electrode configuration of claim 1 wherein said first phase electrodes have rectangular cross sections.

4. The electrode configuration of claim 1 wherein said second phase electrodes have generally Z-shaped cross sections.

5. The electrode configuration of claim 1 wherein said third phase electrodes have generally T-shaped cross sections with horizontal arm portions which respectively overlap adjacent ones of said first and second phase electrodes.

6. A multi-level electrode configuration for a charge coupled device having a channel for movement of charge packets therethrough and an insulating layer overlying said channel, comprising:
    three spaced apart phase buses disposed parallel along one side of said channel;
    phase electrodes extending from said phase buses on said insulating layer across the channel;
    a first set of said phase electrodes extending in spaced relation with each other from a first one of said phase buses, said first set of phase electrodes each having an upper surface and opposite side surfaces covered by a surface insulating layer;
    a second set of said phase electrodes extending in spaced relation with each other from a second one of said phase buses, each electrode of said second set occupying part of the space between two adjacent electrodes of said first set and having a marginal portion in overlapping relation with the upper surface of an electrode of said first set, said electrodes of said second set having upper and side surfaces covered by a surface insulating layer;
    a third set of said phase electrodes extending in spaced relation with each other from the third one of said phase buses, each electrode of said third set occupying the space between an electrode of said first set and an electrode of said second set and having a marginal portion overlying the upper surface of at least one electrode of said first and second sets.

7. The electrode configuration of claim 6 wherein phase electrodes from each of said three buses are arranged in sets to define bit regions along the channel.

8. The electrode configuration of claim 7 wherein said bit regions have a length of approximately 6 mils.

9. The electrode configuration of claim 6, wherein said insulating layer overlying said channel has a uniform thickness along the length of said channel.

10. The electrode configuration of claim 6, wherein said electrodes of said third set have upper surfaces covered by a surface insulating coating.

11. The electrode configuration of claim 6, wherein said phase electrodes and phase buses comprise aluminum, and said surface insulating layers comprise anodized aluminum.

12. The electrode configuration of claim 6, wherein said first phase bus and said first set of phase electrodes comprise polycrystalline semiconductor material, and the said surface insulating layer covering said upper and opposite side surfaces of said first set of said phase electrodes comprises an oxide of said semiconductor material.

* * * * *